(12) United States Patent
Danz et al.

(10) Patent No.: US 7,418,360 B2
(45) Date of Patent: Aug. 26, 2008

(54) PROJECT DESIGN METHOD

(75) Inventors: Mirko Danz, Feucht (DE); Johannes Extra, Erlangen (DE); Michael Franke, Erlangen-Dechsendorf (DE)

(73) Assignee: Siemens Aktiengesellschaft, München (DE)

( * ) Notice: Subject to any disclaimer, the term of this patent is extended or adjusted under 35 U.S.C. 154(b) by 832 days.

(21) Appl. No.: 10/717,170

(22) Filed: Nov. 19, 2003

(65) Prior Publication Data

US 2004/0167639 A1    Aug. 26, 2004

(30) Foreign Application Priority Data

Nov. 19, 2002    (DE)    ............... 102 54 012

(51) Int. Cl.
| | |
|---|---|
| G01M 19/00 | (2006.01) |
| G01L 25/00 | (2006.01) |
| G05B 11/01 | (2006.01) |
| G05B 9/02 | (2006.01) |
| G06F 11/00 | (2006.01) |
| G06F 9/45 | (2006.01) |
| G06F 17/50 | (2006.01) |
| G06F 9/44 | (2006.01) |

(52) U.S. Cl. .................. 702/122; 702/113; 700/21; 700/26; 700/79; 714/38; 716/5; 717/126; 717/127; 717/131

(58) Field of Classification Search .......... 717/101, 717/120, 121, 124, 126, 127, 131; 709/218, 709/224; 705/1, 36; 707/101, 102; 700/229, 700/17, 19, 21, 23, 26, 27, 79; 345/501, 345/582; 702/189, 113, 117, 119, 122; 716/1, 716/4, 5; 714/25, 46, 37, 38
See application file for complete search history.

(56) References Cited

U.S. PATENT DOCUMENTS

| | | | |
|---|---|---|---|
| 5,796,736 A * | 8/1998 | Suzuki ................. 370/254 |
| 5,850,343 A | 12/1998 | Nakamura | |
| 5,950,011 A * | 9/1999 | Albrecht et al. ............. 717/167 |
| 6,078,847 A * | 6/2000 | Eidson et al. ............... 700/229 |
| 6,131,119 A * | 10/2000 | Fukui ......................... 709/224 |
| 6,344,855 B1 * | 2/2002 | Fisher et al. ................ 345/501 |
| 6,430,526 B1 * | 8/2002 | Toll ............................... 703/1 |
| 6,457,050 B1 * | 9/2002 | Cowan et al. ............... 709/224 |
| 6,810,401 B1 * | 10/2004 | Thompson et al. .......... 707/101 |
| 6,871,299 B2 * | 3/2005 | Havekost et al. ............. 714/47 |
| 6,877,033 B1 * | 4/2005 | Garrett et al. ............... 709/218 |
| 6,882,347 B2 * | 4/2005 | Williams .................... 345/582 |

(Continued)

OTHER PUBLICATIONS

PROF.DR.-ING. Uwe Schneider et al.: Teschenbuch der Informatik; 2001; Carl Hanser Verlag Leipzig; pp. 153-161, 205-207 , 214-229 ISBN 3-446-21753-3.

*Primary Examiner*—Crystal Barnes-Bullock
(74) *Attorney, Agent, or Firm*—Henry M. Feiereisen; Ursula B. Day

(57) ABSTRACT

A configurable system for automating a control sequence, in particular a motion sequence, has several components which exchange in regular time intervals during the control sequence with each other information via communication relationships. The system selects exactly one system project design from a plurality of system project designs based on the topology and functionality of the components. Each component of the system has a component project design, which is used by the system to design the components according to the corresponding component project designs. Each component arranges the communication relationships of the other components according to its own component project design.

12 Claims, 5 Drawing Sheets

U.S. PATENT DOCUMENTS

| | | | |
|---|---|---|---|
| 6,885,641 B1 * | 4/2005 | Chan et al. | 370/252 |
| 6,957,186 B1 * | 10/2005 | Guheen et al. | 705/1 |
| 6,980,211 B2 * | 12/2005 | Lin et al. | 345/440 |
| 7,013,328 B2 * | 3/2006 | Monse et al. | 709/208 |
| 7,050,808 B2 * | 5/2006 | Janusz et al. | 455/445 |
| 7,051,309 B1 * | 5/2006 | Crosetto | 716/10 |
| 7,093,247 B2 * | 8/2006 | Ashworth et al. | 717/174 |
| 7,290,039 B1 * | 10/2007 | Lisitsa et al. | 709/217 |
| 2002/0083076 A1 * | 6/2002 | Wucherer et al. | 707/102 |
| 2003/0051049 A1 * | 3/2003 | Noy et al. | 709/238 |
| 2003/0061266 A1 * | 3/2003 | Ouchi | 709/106 |
| 2003/0131078 A1 * | 7/2003 | Scheer et al. | 709/220 |
| 2003/0172150 A1 * | 9/2003 | Kennedy | 709/224 |
| 2003/0229482 A1 * | 12/2003 | Cook et al. | 703/14 |
| 2004/0139238 A1 * | 7/2004 | Luhrs | 710/1 |
| 2005/0119959 A1 * | 6/2005 | Eder | 705/36 |
| 2006/0020429 A1 * | 1/2006 | Brooks et al. | 702/189 |

\* cited by examiner

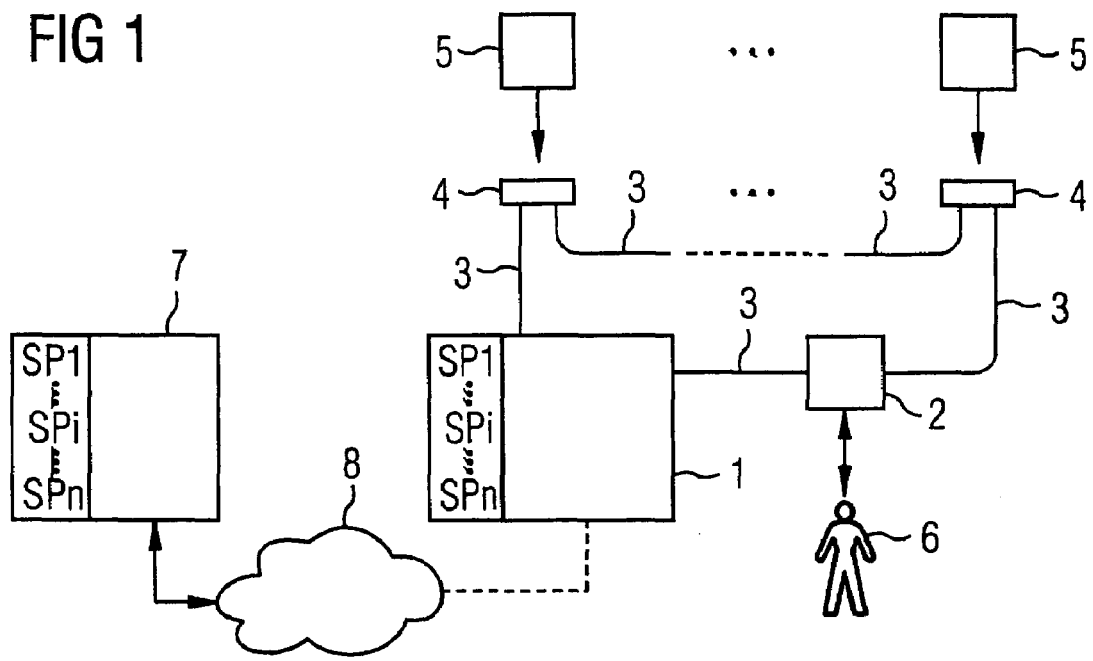

PROJECT DESIGN METHOD

CROSS-REFERENCES TO RELATED APPLICATIONS

This application claims the priority of German Patent Application, Serial No. 102 54 012.8, filed Nov. 19, 2002, pursuant to 35 U.S.C. 119(a)-(d), the disclosure of which is incorporated herein by reference.

BACKGROUND OF THE INVENTION

The present invention relates to a project design method for a configurable system with several components for automating a control sequence, in particular a motion sequence. During the control sequence, for implementing the automation, each component exchanges information with other components in regular time intervals via communication relationships. The control sequence can include controlled movements, for example a movement of an element from one end position to another end position. The control sequence can also include guided movements, for example a displacement of an element according to a predetermined velocity profile or a predetermined travel path.

A number of configurable, in particular modular, systems for automating a mechanical movement are known in the art. Particular examples of such systems are folding and insertion machines.

Systems of this type frequently communicate with each other through a clock-synchronized deterministic communication, which is based on a statistic design of the communication relationships. The control sequence can be automated by having the components exchange information in regular intervals during the control sequence via these communication relationships.

The communication relationships are typically designed by using a design tool supplied by the manufacturer of the modular system or by the manufacturer of the controller for the modular system. The project design is loaded into the system or its components. The project design for each system is limited to the corresponding specific configuration. The operator of the system is typically not able to make changes.

The operator can be given the opportunity to make changes in the configuration by designing all possible communication relationships ahead of time. This approach, however, could have the following two disadvantages. On one hand, the components would then always exchange information, even if no useful data need to be transmitted between the existing components. This results in a significant work load of the communication system. In addition, error correction measures would have to be implemented, in the event that one component attempts to communicate with another component which does not exist in the actual system configuration. Accordingly, error correction measures would have to be implemented when one component does not receive an answer during communication, because its communication partner is non-existent in the system.

It would therefore be desirable and advantageous to provide an improved project design method for a configurable system, which obviates prior art shortcomings and is able to specifically allow an operator of the system to reconfigure the system while also changing the system project design as a result.

SUMMARY OF THE INVENTION

According to one aspect of the invention, a project design method for a configurable system with several components for automating a control sequence, in particular a motion sequence, is disclosed. For implementing an automation of the control sequence, each component exchanges during the control sequence in regular time intervals information with other components via communication relationships. The system selects exactly one system project design from a plurality of system project designs, based on the topology and functionality of the system components. The selected system project design contains exactly one component project design for each component of the system, whereby the system then uses the corresponding component project to design each of the system's components. Each component implements the communication relationship to the other components according to its own component project design.

Embodiments of the invention may include one or more of the following features. The system may obtain the topology and functionality of the components through user input. For example, the user input for at least one component can include a default value relating to the component's mechanical and/or electrical functionality. Moreover, the user input for at least one component can include a default value, wherein the at least one component mechanically and/or electrically cooperates with at least one additional component. More particularly, the user input thereby includes the system-external characteristic of the component, but not the data-related project design itself.

Alternatively, the system can also automatically determine the topology and functionality of its components. No user input is required if the topology and functionality of the components is completely determined.

It is also possible that the system only determines the topology of the components and then supports a user determine the system project design. For example, the system can make a preselection and offer the user only a selection limited to the remaining possibilities.

The topology of the components can usually be identified from an identifier of a plug-in place, optionally in conjunction with determining the type of the various components. Optionally, assuming that a suitable communication structure exists, each component can determine its next neighbor, with the topology then being determined based on this information.

The components can also be identified by using a central unit to read from the components particular codes that indicate the type of the components. Preferably, the central unit can read from the components those component codes that are individually assigned to the components—e.g., MAC addresses (MAC=medium access control) and identify the components based on these component codes. The component codes can be organized so that two otherwise identical components can have different codes. The central unit can determine the type based on an association of the component type with the identified component code.

The various system project designs can be stored centrally, and the component project designs of the selected system project designs can be transmitted to the components. In this case, the system project designs can be stored either within a central unit or external to the system.

The component project designs can also be stored in the corresponding components, and the central unit can transmit to the components selection commands for selecting the component project designs of the selected system project design.

In both cases, the components activate the communication relationships implemented by the components only based on a common activation command.

Preferably, the topology of the components can be accessed by an application program, whereby the implementation of communication can be optimized within the application program.

BRIEF DESCRIPTION OF THE DRAWING

Other features and advantages of the present invention will be more readily apparent upon reading the following description of currently preferred exemplified embodiments of the invention with reference to the accompanying drawing, in which:

FIG. 1 shows schematically a configurable system for automating a control sequence;

FIG. 3 shows a schematic system project design;

DETAILED DESCRIPTION OF PREFERRED EMBODIMENTS

Figure 2:
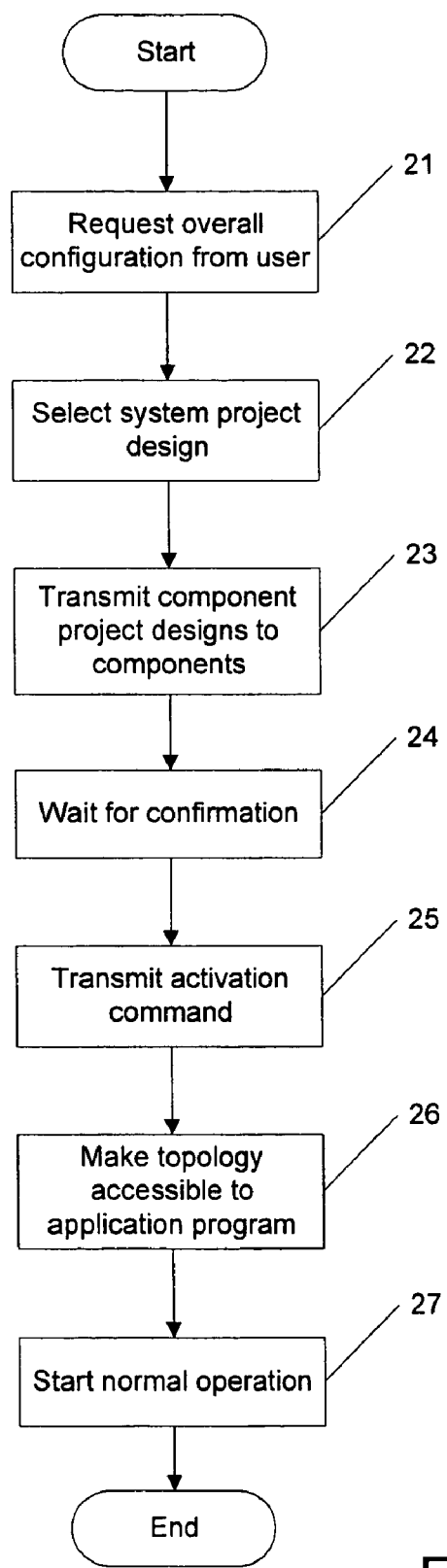
FIG. 2 shows a schematic flow diagram.

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a system for automating an industrial control sequence, in particular a motion sequence, which includes a central unit 1 and a man-machine interface 2, hereinafter referred to as HMI 2. A cable 3 runs from the central unit 1 to an plug-in place 4, etc. From this plug-in place, a further cable 3 runs to an additional plug-in place 4. A cable 3 runs from the last plug-in place 4 to the HMI 2, which is likewise connected via a cable 3 with the central unit 1. A module 5 can be inserted in each of the plug-in places 4.

The system for automating the control sequence therefore has a cyclical organization. It typically consists of the central unit 1, the HMI 2 and several modules 5. The modules 5 are exchangeable and form together with the central unit 1 and the HMI 2 the components 1, 2, 5 of the system. A different configuration of the system is obtained depending on which of the modules 5 are used, how the individual modules 5 cooperate with each other mechanically and/or electrically, and how the modules 5 are arranged, connected and designed. In other words, the system is configurable.

Each component 1, 2, 5 of the system can communicate with its neighbor to the left as well as with its neighbor to the right. In other words, a communication relationship is established between neighbors. The components 1, 2, 5 exchange information with each other via the communication relationships for implementing the automation of the control sequence, i.e. during normal operation. The information exchange between each of the components 1, 2, 5 occurs alternatingly to the left and to the right. The communications occur in regular time intervals T, e.g. according to the IRTE protocol (IRTE=industrial real time Ethernet).

When the system starts up, the central unit 1 performs the process depicted in FIG. 2, which will now be described:

In step 21, the central unit 1 initially requests from an operator 6 information about the topology and functionality of the components. In a following step 22, the central unit 1 selects exactly one system project design from a plurality of system project designs based on the predetermined topology and functionality of the components.

According to FIG. 1, the plurality of system project designs SP1. Spn is centrally stored in the central unit 1. Alternatively, as indicated in FIG. 1 by the dotted line, the system configurations SP1. Spn can also be stored centrally, but outside the central unit 1 or even external to the system. In this case, the system project designs SP1. Spn can be stored, for example, in a central computer 7 which can be accessed by the central unit 1 via a computer network 8, for example the Internet 8. Mixed implementations are also feasible. For example, a mapping routine could be stored in the central unit 1, for example in the form of a lookup table, based on which the required system project design SPi can be determined from the topology and functionality of the components 1, 2, 5 of the system. The system project designs SP1. Spn can be stored, for example, in the central computer 7.

According to FIG. 3, each of the system project designs SP1 . . . Spn, in particular the selected system project design SPi, includes a component project design KP1$i$, . . . , KPmi for each component 1, 2, 5. In step 23, the central unit 1 transmits the component project designs KP1$i$, . . . , KPmi to the HMI 2 and the modules 5. A transmission to the central unit 1 is for obvious reasons unnecessary.

In step 24, the central unit waits for a confirmation from the HMI 2 and the modules 5, respectively, to confirm that the HMI 2 and the modules 5 have successfully concluded their project design. Only after the confirmations have been received does the central unit 1 transmit in step 25 a common activation command to the components 2, 5. In step 26, the central unit 1 then makes available to an application program at least the topology of the components 1, 2, 5. The central unit 1 then resumes its normal operation in step 27.

Figure 4:
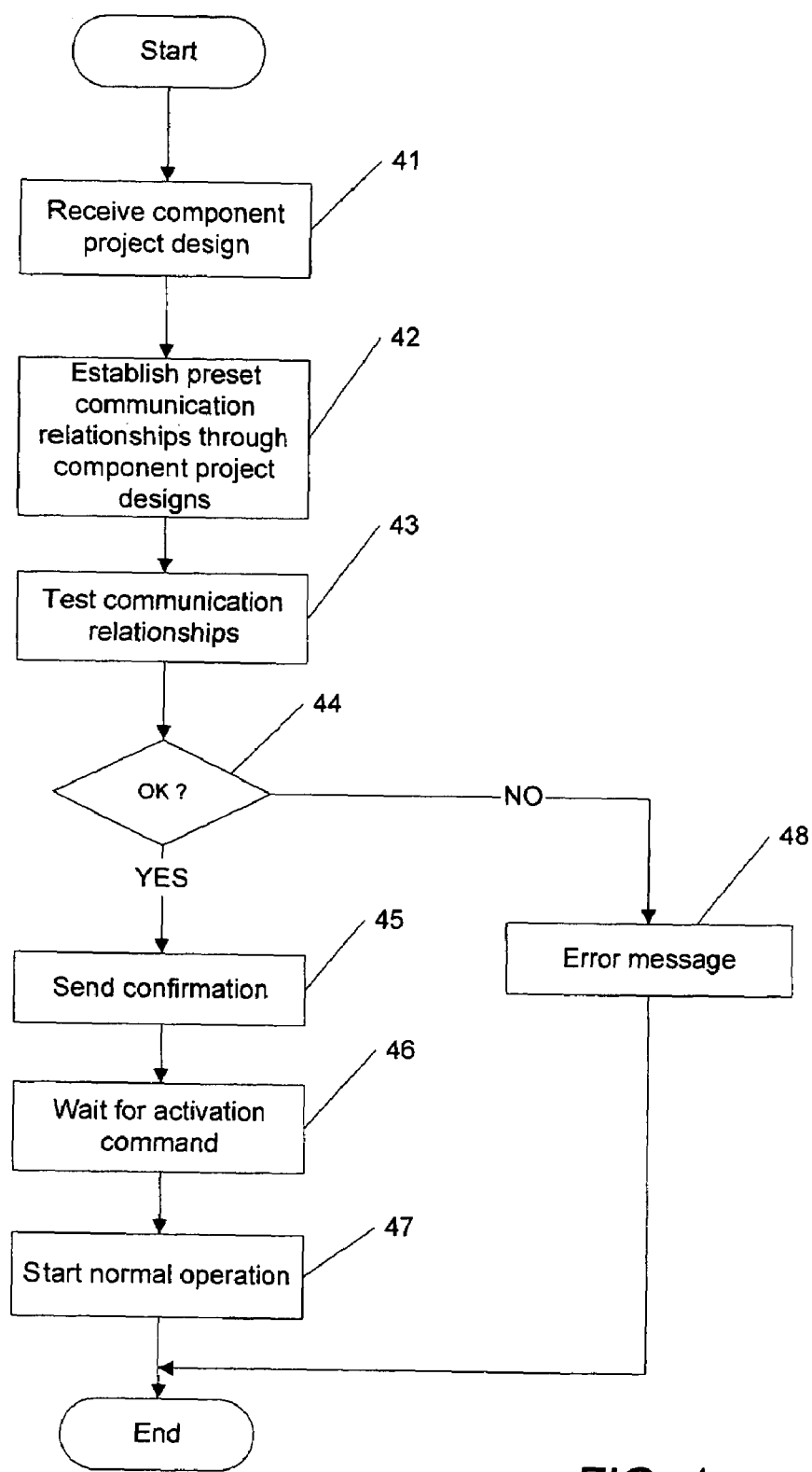
FIG. 4 shows schematically a flow diagram for automatically design component relationships.

The components 1, 2, 5 can automatically perform their own project design, as depicted in step 42 of FIG. 4, according to the corresponding component project design KPji. Accordingly, the components 1, 2, 5 establish in step 42 the communication relationships to their neighboring components 1, 2, 5. With the exception of the central unit 1, the components 2, 5 receive in step 41, i.e., prior to executing step 42, the corresponding component project designs KPji for each component 2, 5.

The components 1, 2, 5 then test the communication relationships in step 43. If the communication relationships to the other components 1, 2, 5 were successfully established, then the components 2, 5 transmit in step 45 a confirmation message to the central unit 1. The components 2, 5 then wait in step 46 for transmission of the activation command. The components 2, 5 resume normal operation in step 47 only after receipt of the activation command.

If errors in the communication relationships were detected in step 44, then the process branches to step 48. In step 48, the components 2, 5 transmit an error message to the central unit 1.

The aforedescribed project design method can always be performed, but is burdensome for the operator 6. It would be more convenient for the operator 6, if the system could automatically select the system project design SPi, as far as this is feasible. Such an approach will be described hereinafter with reference to FIG. 5. The flow diagram of FIG. 5 is essentially an embodiment of step 21 of FIG. 2.

Figure 5:
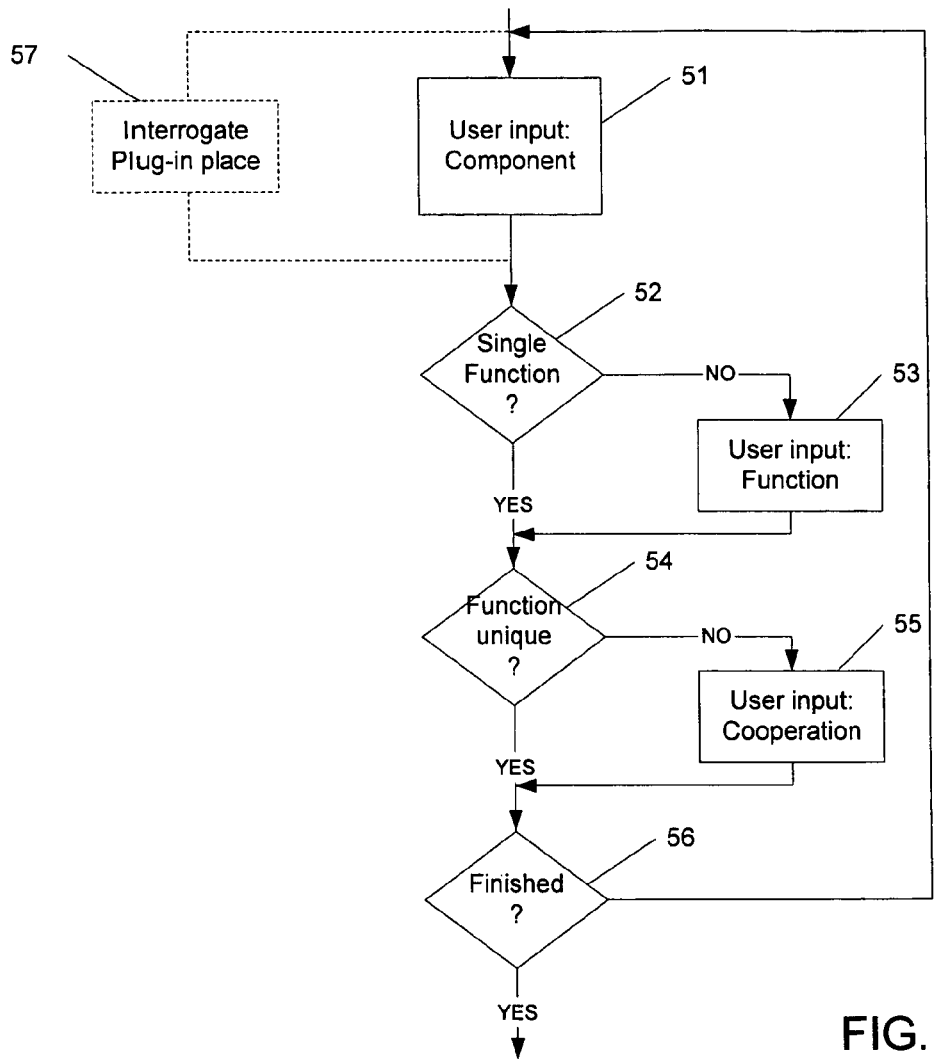
FIG. 5 shows schematically a flow diagram for automatically design a system project.

According to FIG. 5, in step 51, the central unit requests information from a user 6 about the identity of the component 5 arranged in the first plug-in place 4. The central unit 1 then checks in step 52 if the inputted component 5 can perform only a single mechanical and/or electrical functionality. If the component 5 is capable of performing several functionalities, then the central unit 1 will ask the user 6 in step 53 which functionality is to be implemented. Otherwise, the central unit 1 continues directly with a step 54.

In step 54, the central unit 1 checks if the communication relationships of the last entered component 5 are unique. If this is not the case, then the central unit 1 asks the user 6 in step 55, with which additional components 1, 2, 5 the entered component 5 is supposed to cooperate mechanically and/or electrically. In step 56, it is then checked or inquired if all modules 5 have been entered. It is not the case, then the process returns to step 51; otherwise the process continues with step 22 of FIG. 2.

According to FIG. 5, the user input for the components 5 includes a default value of their mechanical and/or electrical functionality as well as a default condition specifying the additional components 1, 2, 5 with which the components 5 are supposed to cooperate mechanically and/or electrically. User input is only requested if necessary for determining the system project design SPi.

As indicated in FIG. 1 by the dashed line, step 57 can be carried out instead of step 51. In step 57, the central unit 1 automatically interrogates the various plug-in places 4 and determines which modules are arranged in the corresponding plug-in places 4. In other words, the central unit 1 automatically determines the topology of the components 1, 2, 5 of the system.

If the functionality of the components 5 based on the determined modules 5 is already unique, then the system can also automatically determine its system project design SPi based on the automatically determined components 1, 2, 5 and their topology. Even if this is not the case, at least the number of input parameters to be entered by the user 6 can be minimized. In this case, too, the system supports the user 6 determine the system project design SPi.

Figure 6:
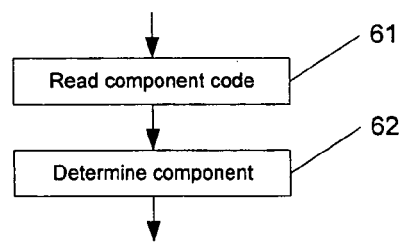
FIG. 6 shows schematically a flow diagram for determining a component ID.

The individual plug-in places 4 can be interrogated in a known manner, for example, by plug-in place identification and/or (physical) plug-in place addressing. For example, the type of the existing modules 5 can be determined by interrogating the plug-in places 4. However, in step 61, the central unit 1 according to FIG. 6 may initially read component codes from the components 2, 5. The component codes individually identify the respective component 5. In other words, the component codes not only indicate the type of the component 5, but also differentiate the component from other components 5 of the same type. The component codes are therefore unique for the corresponding physical component 5.

The component codes are organized according to a known scheme. The central unit 1 is therefore able to determine the components 5 (or their type, which is essential here) based on the component codes interrogated in step 61.

Figure 7:
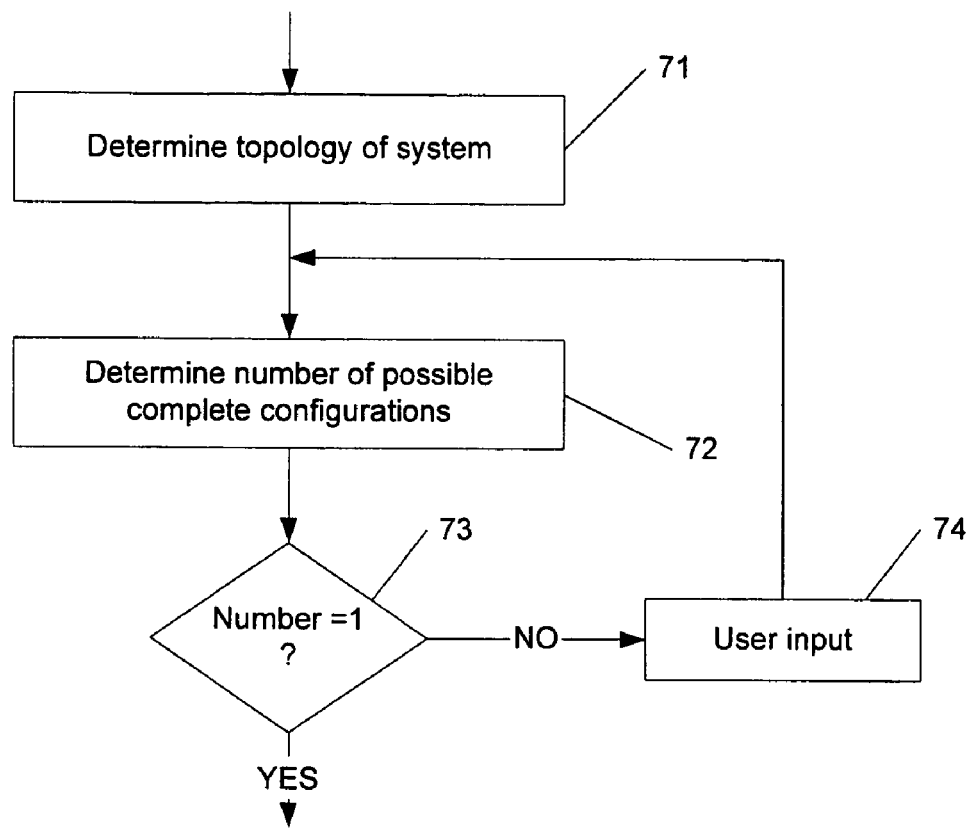
FIG. 7 shows schematically a flow diagram for resolving a topological ambiguity.

If the corresponding system project design SPi could not be uniquely determined based on the topology that was automatically determined by the system, then the method according to FIG. 7 is preferably carried out.

According to FIG. 7, in step 71, the central unit 1 first determines the topology of the system. In step 72, the central unit 1 then determines the possible system project designs SPi and their overall number. In step 73, the central unit 1 checks if this overall number is equal to one. If this is the case, then the process continues with step 22 of FIG. 2. Otherwise, in step 74, input is requested from a user 6 in order to more accurately determine the system project design SPi. The process then returns from step 74 to step 72. Depending on the type of the employed components 1, 2, 5, the system can therefore use the topological information to determine in part or completely the system project design SPi of the system. Here, too, the user 6 is aided to the greatest extent possible.

Figure 8:
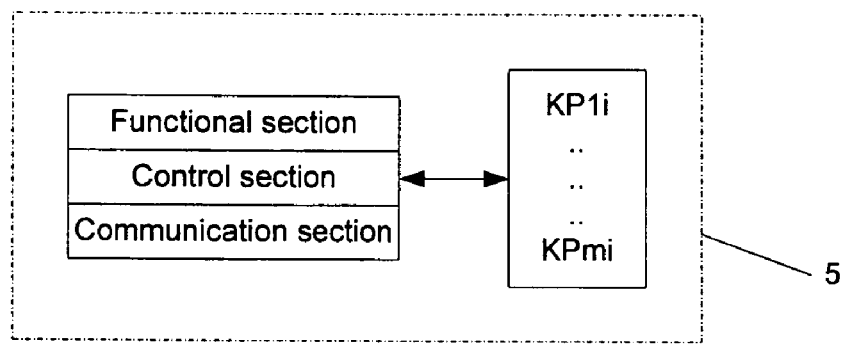
FIG. 8 shows a schematic component of the configurable system.

In the aforedescribed embodiment of the invention, the system project designs SP1 . . . SPn are stored in the central unit 1 or external to the system. According to FIG. 8, the component project designs KPji can also be stored in the corresponding components 2, 5. In this case, step 23 of FIG. 2 has to be modified. Instead of transmitting the actual component project designs KPji, the central unit 1 then transmits to the components 2, 5 only selection commands for selecting the corresponding component project designs KPji.

The project design method of the invention hence makes it easy for an end user or operator 6 to reconfigure the system, including changing designs and implementing new designs.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:
1. A project design method for automating a control sequence in a configurable system with a plurality of components, the components capable of exchanging at regular time intervals during the control sequence information with another of the components via communication relationships, comprising the steps of:
  with the system, based on a topology and a functionality of the components communicated to the system by a user input, selecting exactly one system project design from a plurality of system project designs, with the selected system project design containing exactly one component project design for each component of the system;
  designing each of the components in the system according to the corresponding component project design;
  causing each of the components to implement the communication relationships to the other components according to the component project design of the particular component,
  testing the communication relationships to the other components and, if the communication relationships to the other components are successfully established, transmitting a confirmation message to a central unit and, upon receipt of an activation command from the central unit, resuming normal operation, and if the communication relationships to the other components has errors, transmitting an error message to the central unit.

2. The project design method of claim 1, wherein the user input for at least one component includes a default value of a mechanical and/or electrical functionality of the at least one component.

3. The project design method of claim 1, wherein the user input for at least one component includes a default value to cooperate mechanically or electrically, or both, with at least one additional component.

4. The project design method of claim 1, wherein the system automatically determines the topology of the components and aids a user in determining the system project design.

5. The project design method of claim 1, wherein the central unit reads component codes from the components, said component codes separately identifying the components, and determines the components based on the component code.

6. The project design method of claim 1, wherein the plurality of system project designs is centrally stored and the component project designs of the selected system project designs are transmitted to the components.

7. The project design method of claim 6, wherein the plurality of system project designs is stored in the central unit of the system.

8. The project design method of claim 6, wherein the plurality of system project designs is stored external to the system.

9. The project design method of claim 1, wherein the component project designs are stored in the corresponding components, and wherein the central unit transmits selection commands to the components for selecting the component project designs according to the selected system project design.

10. The project design method of claim 1, wherein the components activate the communication relationships established by the components based on a common activation command.

11. The project design method of claim 1, wherein the communication relationships conform to the IRTE protocol.

12. The project design method of claim 1, wherein at least the topology of the components is made available to an application program for the configurable system.

* * * * *